(12) United States Patent
Li et al.

(10) Patent No.: US 8,341,506 B2
(45) Date of Patent: Dec. 25, 2012

(54) TECHNIQUES FOR CORRECTING ERRORS USING ITERATIVE DECODING

(75) Inventors: Zongwang Li, San Jose, CA (US); Yuan Xing Lee, San Jose, CA (US); Richard Leo Galbraith, Rochester, MN (US); Ivana Djurdjevic, San Jose, CA (US); Travis Roger Oenning, Rochester, MN (US)

(73) Assignee: HGST Netherlands B.V., Amsterdam (NL)

( * ) Notice: Subject to any disclaimer, the term of this patent is extended or adjusted under 35 U.S.C. 154(b) by 1438 days.

(21) Appl. No.: 11/694,676

(22) Filed: Mar. 30, 2007

(65) Prior Publication Data
US 2008/0244359 A1    Oct. 2, 2008

(51) Int. Cl.
*H03M 13/00*    (2006.01)
*H03M 13/03*    (2006.01)

(52) U.S. Cl. .................. 714/780; 714/794; 714/795

(58) Field of Classification Search .............. 714/794, 714/795, 780
See application file for complete search history.

(56) References Cited

U.S. PATENT DOCUMENTS

| | | | |
|---|---|---|---|
| 5,267,265 A * | 11/1993 | Mizoguchi | 375/233 |
| 5,367,536 A * | 11/1994 | Tsujimoto | 375/269 |
| 5,432,522 A * | 7/1995 | Kurokami | 342/361 |
| 5,712,873 A * | 1/1998 | Shiue et al. | 375/233 |
| 5,761,248 A * | 6/1998 | Hagenauer et al. | 375/340 |
| 5,995,568 A * | 11/1999 | Molnar et al. | 375/354 |
| 6,161,209 A * | 12/2000 | Moher | 714/780 |
| 6,518,892 B2 * | 2/2003 | Shen et al. | 341/50 |
| 6,581,182 B1 | 6/2003 | Lee | |
| 6,587,987 B1 | 7/2003 | Vasic et al. | |
| 6,631,494 B2 * | 10/2003 | Patapoutian | 714/788 |
| 6,633,856 B2 * | 10/2003 | Richardson et al. | 706/15 |
| 6,751,255 B1 * | 6/2004 | Reuven et al. | 375/233 |
| 6,757,117 B1 * | 6/2004 | Livingston | 360/25 |
| 6,757,122 B1 * | 6/2004 | Kuznetsov et al. | 360/53 |
| 6,778,599 B1 * | 8/2004 | Doron | 375/232 |
| 6,795,947 B1 | 9/2004 | Siegel et al. | |
| 6,888,897 B1 * | 5/2005 | Nazari et al. | 375/262 |
| 6,965,652 B1 * | 11/2005 | Burd et al. | 375/341 |
| 7,017,106 B2 * | 3/2006 | Shen et al. | 714/801 |
| 7,107,511 B2 * | 9/2006 | Shen et al. | 714/794 |
| 7,164,764 B2 * | 1/2007 | Zimmerman et al. | 379/417 |
| 7,184,486 B1 * | 2/2007 | Wu et al. | 375/262 |
| 7,206,364 B2 * | 4/2007 | Miller | 375/341 |
| 7,269,235 B2 * | 9/2007 | Miller | 375/340 |
| 7,281,190 B2 * | 10/2007 | Souvignier et al. | 714/755 |
| 7,340,003 B1 * | 3/2008 | Nazari et al. | 375/262 |
| 7,366,261 B2 * | 4/2008 | Miller | 375/341 |

(Continued)

OTHER PUBLICATIONS

Ben Lu, Guosen Yue and Xiaodong Wang, Performance Analysis and Design Optimization of LDPC-Coded MIMO OFDM Systems, IEEE Transactions on Signal Processing, vol. 52, No. 2, Feb. 2004, pp. 348-361.*

(Continued)

*Primary Examiner* — Joseph D Torres
(74) *Attorney, Agent, or Firm* — Steven J. Cahill

(57) ABSTRACT

Techniques are provided for iteratively decoding data recorded on a data storage device. An iterative decoder decodes the data using multiple decoding iterations to correct errors. In multiple iterations of the iterative decoder, a post processing block generates soft information, and a decoder applies a minimum sum decoding algorithm to a low density parity check (LDPC) code to generate extrinsic information based on the soft information and updated soft information.

20 Claims, 7 Drawing Sheets

U.S. PATENT DOCUMENTS

| | | | | |
|---|---|---|---|---|
| 7,415,079 | B2* | 8/2008 | Cameron et al. | 375/340 |
| 7,428,275 | B2* | 9/2008 | Miller | 375/340 |
| 7,434,136 | B2* | 10/2008 | Ichihara et al. | 714/755 |
| 7,447,985 | B2* | 11/2008 | Tran et al. | 714/801 |
| 7,453,960 | B1* | 11/2008 | Wu et al. | 375/340 |
| 7,466,771 | B2* | 12/2008 | Miller | 375/340 |
| 7,536,628 | B2* | 5/2009 | Kan et al. | 714/780 |
| 7,561,627 | B2* | 7/2009 | Chow et al. | 375/260 |
| 7,567,666 | B2* | 7/2009 | Zimmerman et al. | 379/417 |
| 7,580,485 | B1* | 8/2009 | Burd et al. | 375/341 |
| 7,587,659 | B2* | 9/2009 | Tran et al. | 714/794 |
| 7,620,882 | B2* | 11/2009 | Kanaoka et al. | 714/794 |
| 7,751,505 | B1* | 7/2010 | Wu et al. | 375/340 |
| 7,770,090 | B1* | 8/2010 | Kons et al. | 714/780 |
| 7,801,233 | B1* | 9/2010 | Chow et al. | 375/260 |
| 2003/0101410 | A1 | 5/2003 | Betti et al. | |
| 2004/0168114 | A1 | 8/2004 | Richardson et al. | |
| 2004/0225950 | A1 | 11/2004 | Siegel et al. | |
| 2005/0094742 | A1* | 5/2005 | Yee | 375/267 |
| 2006/0150065 | A1 | 7/2006 | Song et al. | |
| 2006/0265634 | A1 | 11/2006 | Silvus et al. | |
| 2007/0089016 | A1* | 4/2007 | Bhatt et al. | 714/752 |
| 2007/0089017 | A1* | 4/2007 | Tang et al. | 714/752 |
| 2007/0089018 | A1* | 4/2007 | Tang et al. | 714/752 |
| 2007/0089019 | A1* | 4/2007 | Tang et al. | 714/752 |
| 2007/0168833 | A1* | 7/2007 | Lestable et al. | 714/758 |
| 2007/0201632 | A1* | 8/2007 | Ionescu | 379/88.01 |
| 2007/0234178 | A1 | 10/2007 | Richardson et al. | |
| 2008/0052595 | A1* | 2/2008 | Haratsch et al. | 714/758 |

OTHER PUBLICATIONS

Ben Lu, Xiaodong Wang, and Krishna R. Narayanan, LDPC-Based Space—Time Coded OFDM Systems Over Correlated Fading Channels: Performance Analysis and Receiver Design, IEEE Transactions on Communications, vol. 50, No. 1, Jan. 2002, pp. 74-88.*

Abhiram Prabhakar and Krishna Narayanan, A Memory Efficient Serial LDPC Decoder Architecture, 2005, IEEE, pp. V-41 to V-44.*

Jun Zheng, and Bhaskar D. Rao, LDPC-Coded MIMO Systems With Unknown Block Fading Channels: Soft MIMO Detector Design, Channel Estimation, and Code Optimization, IEEE Transactions on Signal Processing, vol. 54, No. 4, Apr. 2006, pp. 1504-1518.*

Hongwei Song, and B.V.K. Vijaya Kumar, "Low-Density Parity-Check Codes for Partial Response Channels," IEEE Signal Processing Magazine, Jan. 2004, pp. 56-66.

J. Hu, et al., "Coding and Iterative Decoding for Patterned Media Storage Systems," Electronics Letters, Aug. 3, 2006, vol. 42, No. 16, pp. 934-935.

European Patent Office search report and search opinion for European patent application 07254474.5, Mar. 5, 2008.

Libero Dinoi et al., "Design of Variable-rate Irregular LDPC Codes with Low Error Floor," http://ieeexplore.ieee.org/iel5/9996/32109/01494431.pdf?arnumber=1494431, 2005, pp. 647-651.

Axel Huebner et al., "A Simple Method of Approximating the Error Floor of Turbo Codes with S-Type Permutors," ISIT 2004, Chicago, USA, Jun. 27-Jul. 2, 2004, p. 473, http://ieeexplore.ieee.org/iel5/9423/29909/01365510.pdf?arnumber=1365510.

Juntan Zhang, et al., "Improved Min-Sum Decoding of LDPC Codes Using 2-Dimensional Normalization," pp. 1-6.

Jin Sha et al., "A Memory Efficient FPGA Implementation of Quasi-Cyclic LDPC Decoder," Proceedings of the 5th WSEAS Int. Conf. on Instrumentation, Measurement, Circuits and Systems, Hangzhou, China, Apr. 16-18, 2006, pp. 218-223.

* cited by examiner

TECHNIQUES FOR CORRECTING ERRORS USING ITERATIVE DECODING

BACKGROUND OF THE INVENTION

The present invention relates to techniques for correcting errors, and more particularly, to techniques for correcting errors using iterative decoding in data storage devices, such as hard disk drives.

Error correcting codes are used in data recording devices to ensure data reliability and to reduce the adverse effects of channel noise. Parity codes are examples of error correction codes. Parity codes are often used to correct errors that occur in data transmitted over a communications channel or stored on a digital storage medium. For example, parity check codes are often used to correct errors in data stored on magnetic hard disks.

Error correction decoding can be performed using hard decision decoders or soft-decision decoders. Hard decision decoding is generally based on an assumption that all bits in a codeword are equally likely to be in error. Hard decision decoding generally does not consider that some bits are more reliable than others. However, some hard decision decoding codes do provide un-equal protection to recorded bits.

Soft-decision decoding receives input analog data (e.g., an equalized read-back signal or bit reliability information) and preferentially flips unreliable bits. In soft decision decoding, the log-likelihood ratio (LLR) is a measure of the likelihood of a bit being a '1' divided by the likelihood of the bit being '0.' A greater absolute value of LLR indicates a more reliable bit. A soft decision decoder uses the LLR for each bit to evaluate the probability that the bit is in error. Soft-decision decoding out-performs hard-decision decoding, because it is able to exploit the fact that some bits are more reliable than others.

A low density parity check (LDPC) code is a linear error-correcting code that has a parity check matrix H with a small number of nonzero elements in each row and column. LDPC codewords can be decoded using soft-decision decoding. LDPC codes can be defined over any finite field. For example, an LDPC codes can be defined over a Galois field GF(2), in which "1" is the only nonzero element. The row (or column) weight (or degree) of an LDPC code refers to the number of elements that have a non-zero value among the numbers in rows (or columns) of the parity check matrix.

In a standard encoding process, a block of information bits is encoded using a generator matrix that can be derived from the parity check matrix of a LDPC code. In soft-decision decoding, the strength of error protection that is provided to each bit depends on the weight of the corresponding column in the parity check matrix that is used to decode the codewords. Bits corresponding to the columns with a lower weight are provided less error protection.

Some types of error detection schemes are iterative. One problem with iterative error detection schemes is that they tend to cause error propagation and to have an unacceptable error floor when used in magnetic hard disk drives. Also, many iterative error detection schemes used in magnetic hard disk drives have a high degree of complexity.

Therefore, it would be desirable to provide iterative techniques for correcting errors that cause less error propagation and that do not have a high degree of complexity. It would also be desirable to provide iterative techniques for correcting errors that have a controllable error floor.

BRIEF SUMMARY OF THE INVENTION

The present invention provides techniques for iteratively decoding data recorded on a data storage device. An iterative decoder decodes the data using multiple decoding iterations to correct errors. In multiple iterations of the iterative decoder, a post processing block generates soft information, and a decoder applies a minimum sum decoding algorithm to a low density parity check (LDPC) code to generate extrinsic information based on the soft information and updated soft information.

Other objects, features, and advantages of the present invention will become apparent upon consideration of the following detailed description and the accompanying drawings.

DETAILED DESCRIPTION OF THE INVENTION

Figure 1:
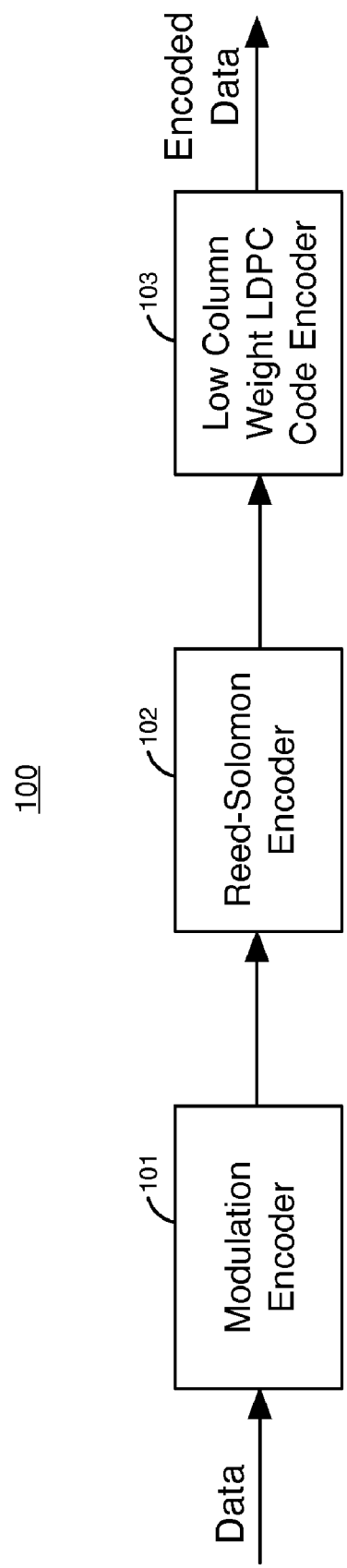
FIG. 1 illustrates an error correction and modulation encoding scheme, according to an embodiment of the present invention.

FIG. 1 illustrates an error correction and modulation encoding scheme, according to an embodiment of the present invention. Initially, input data is encoded by a modulation encoder 101 using a modulation encoding technique. The output stream of modulation encoder 101 is provided to Reed-Solomon (RS) encoder 102. RS encoder 102 generates RS check bytes that provide error correction capabilities.

The output stream of RS encoder 102 is provided to low column weight low density parity check (LDPC) code encoder 103. LDPC code encoder 103 generates LDPC code check bytes that provide an additional level of error correction to the data stream. A magnetic hard disk drive can record the encoded output data of encoder 103 on a magnetic hard disk using any suitable magnetic data recording technique.

According to some embodiments of the present invention, error correction decoders perform multiple (N) decoding iterations. The iterative decoders perform multiple decoding iterations using soft decision post processors and minimum sum LDPC code decoders. Various specific decoding examples of the present invention are now described to illustrate further principles of the present invention.

Figure 2:
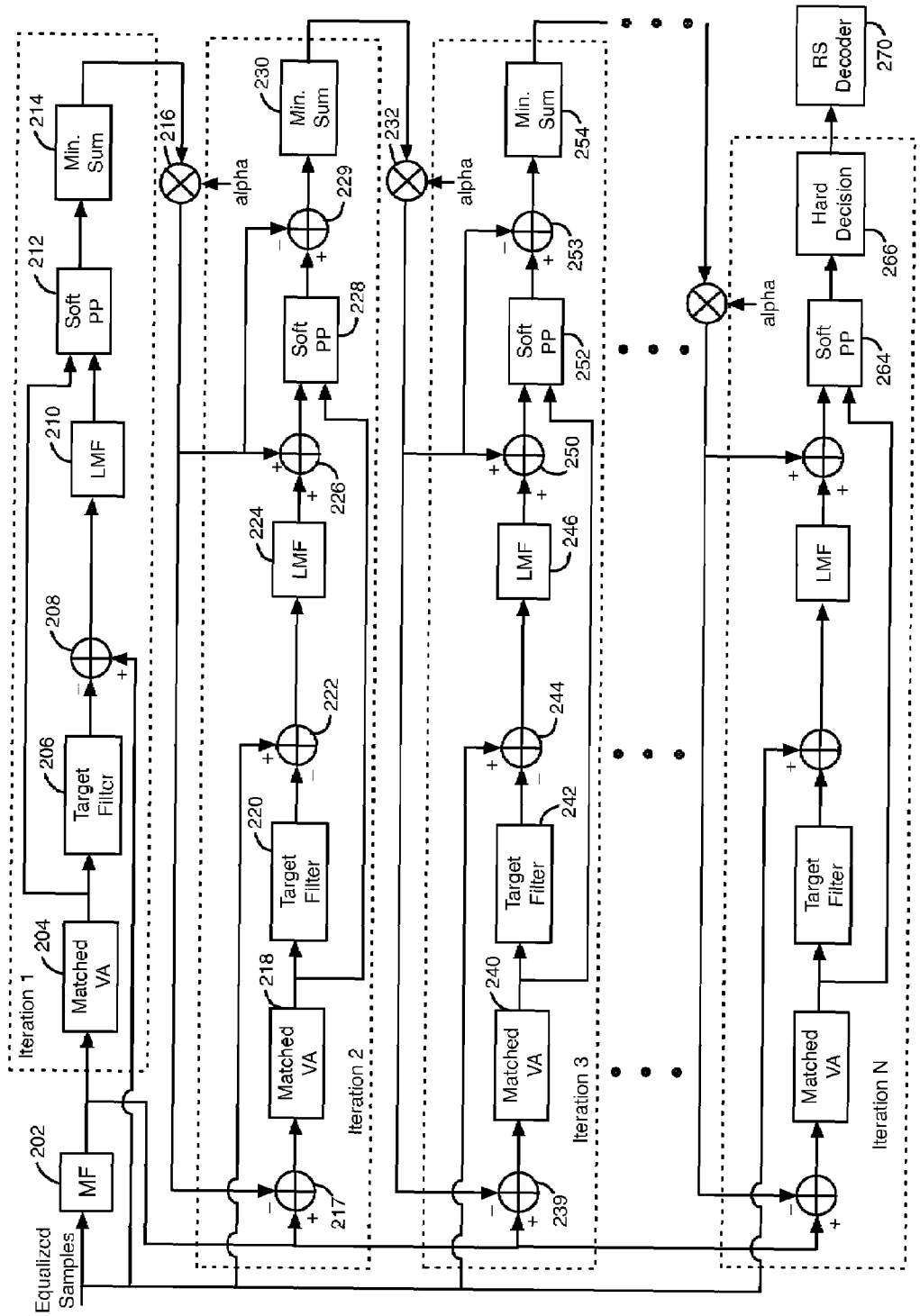
FIG. 2 illustrates a first example of an iterative error correction decoder, according to an embodiment of the present invention.

FIG. 2 illustrates a first example of an iterative error correction decoder, according to an embodiment of the present invention. The error correction decoder of FIG. 2 and other decoders of the present invention can be used in hard disk drives or other types of storage devices. According to some embodiments of the present invention, the iterative decoders cause less error propagation, provide a more controllable error floor, and are less complex.

Initially, an input equalizer (not shown) receives an input stream of data that is read from a data storage medium such as a magnetic hard disk. The equalizer generates a stream of equalized samples that represent the data. The equalized samples are transmitted to inputs of MF 202, adder 208, adder 222, adder 244, and other adders in the decoder. Block MF 202 and the other MF blocks described herein are long matched noise whiten filters. Block MF 202 allows the error signals to pass through the longer noise whiten filter to further restrain the inter-symbol interference (ISI) residual noise and other noise.

The decoder of FIG. 2 performs an N number of decoding iterations on the equalized samples. N can be any suitable positive integer number greater than 1. Iterations 1, 2, 3, and N are shown in FIG. 2, as an example. Iteration 1 includes matched Viterbi block 204, target filter block 206, adder 208, LMF 210, soft post processor 212, and soft-input-soft-output decoder (minimum sum decoder) 214. Iteration 2 includes adder 217, matched Viterbi block 218, target filter block 220, adder 222, LMF 224, adder 226, soft post processor 228, adder 229, and minimum sum decoder 230. Iteration 3 includes adder 239, matched Viterbi block 240, target filter block 242, adder 244, LMF 246, adder 250, post processor 252, adder 253, and minimum sum decoder 254.

In the first iteration of the decoder (iteration 1), the output stream of MF 202 is processed by a matched Viterbi algorithm in detector 204. Matched Viterbi detector 204 generates an output stream that is transmitted to inputs of target filter block 206 and soft post processor 212. The target filter block 206 recovers the ideal equalized samples from the output stream of detector 204.

Adder 208 subtracts the ideal equalized samples generated by target filter block 206 from the corresponding equalized samples in the input stream of the decoder. The equalized samples from the input stream of the decoder are delayed by the delay of blocks 202, 204, and 206 before being used by adder 208. In general, equalized samples in the input stream of the decoder are delayed by the delay of previous blocks before being used by the current block in FIG. 2 (e.g., adders 222 and 244) and in other embodiments described below. The output stream of adder 208 is transmitted to an input of long match filter (LMF) 210. LMF 210 generates an output stream with whiten noise that is transmitted to soft post processor 212.

Soft post processor 212 receives output streams from matched Viterbi detector 204 and LMF 210. Soft post processor 212 generates soft information including a most likely detected bit stream and reliability metric values corresponding to each detected bit. The soft information generated by soft post processor 212 is transmitted to the input of minimum sum decoder 214.

Minimum sum decoder 214 applies a minimum sum decoding algorithm to a low density parity check (LDPC) code to generate more reliable updated soft information using the soft information generated by soft post processor 212. Minimum sum decoder 214 then computes the difference between the updated soft information and the soft information generated by soft post processor 212 to generate extrinsic information. The extrinsic information from minimum sum decoder 214 (and from the other minimum sum decoders described herein) is the difference in the metric between the updated soft information and the soft information generated by soft post processor 212.

In soft-decision decoding, multiple decoding local iterations are performed to try to make the received word converge to a more reliable word (i.e., a codeword or a word with Hamming distance close to a codeword). The minimum sum decoders used in the decoder of FIG. 2 have a low level of complexity, because they use LDPC codes that have low weights, and because they use a small number (e.g., 1 or 2) of local iterations. Also, the minimum sum decoders of FIG. 2 cause less error propagation and have a more controllable error floor, because they use low weight LDPC codes and less local iterations.

The output stream of minimum sum decoder 214 is transmitted to multiplier 216. Multiplier 216 multiplies extrinsic information in the output stream of minimum sum decoder 214 by a scale factor alpha. The output stream of multiplier 216 is transmitted to inputs of adders 217, 226, and 229, beginning the second iteration of the decoder.

Adder 217 subtracts the scaled extrinsic information in the output stream of multiplier 216 from matched equalized samples in the output stream of MF 202. The output stream of matched equalized samples of MF 202 are delayed by the delay of iteration 1 before being input to adder 217. In general, the output stream of matched equalized samples of the MF block are delayed by the delays of previous iterations before being used by the current iteration, in the embodiment of FIG. 2 and in the embodiment of FIG. 6 described below. Detector 218 then performs a matched Viterbi algorithm on the output stream of adder 217. Matched Viterbi block 218 generates an output stream that is transmitted to inputs of target filter block 220 and soft post processor 228.

Adder 222 subtracts the recovered equalized samples generated by target filter block 220 from the corresponding original equalized samples. The output stream of adder 222 is transmitted to an input of LMF 224. Adder 226 adds scaled extrinsic information in the output stream of multiplier 216 to the output stream of LMF 224.

Soft post processor 228 receives output streams from matched Viterbi detector 218 and adder 226. Soft post processor 228 generates soft information including a most likely detected bit stream and reliability metric values corresponding to each detected bit. The soft information generated by post processor 228 is transmitted to the input adder 229. Adder 229 subtracts the scaled extrinsic information in the output stream of multiplier 216 from the soft information in the output stream of post processor 228.

Minimum sum decoder 230 applies a minimum sum low density parity check (LDPC) code to generate more reliable updated soft information using the soft information from adder 229. Minimum sum decoder 230 then computes the difference between the updated soft information and the soft information from adder 229 to generate extrinsic information. The output stream of minimum sum decoder 230 is transmitted to the input of multiplier 232. Multiplier 232 multiplies the output stream of minimum sum decoder 230 by a scale factor alpha.

The output stream of multiplier 232 is transmitted to adder 239, beginning the third iteration of the decoder. Adder 239 subtracts scaled extrinsic information in the output stream of multiplier 232 from error signals in the output stream of MF 202. Detector 240 performs a matched Viterbi algorithm on the output stream of adder 239. Matched Viterbi block 240 generates an output stream that is transmitted to inputs of target filter block 242 and soft post processor 252.

Adder 244 subtracts the recovered equalized samples generated by target filter block 242 from the corresponding original equalized samples. The output stream of adder 244 is transmitted to an input of LMF 246. Adder 250 adds the output stream of multiplier 232 with the output stream of LMF 246.

Soft post processor 252 receives output streams from matched Viterbi detector 240 and from adder 250. Soft post processor 252 generates soft information including a most likely detected bit stream and reliability metric values corresponding to each detected bit. The soft information generated by post processor 252 is transmitted to adder 253.

Adder 253 subtracts scaled extrinsic information in the output stream of multiplier 232 from soft information in the output stream of soft post processor 252. Minimum sum decoder 254 applies a minimum sum decoding algorithm to a low density parity check (LDPC) code to generate more reliable updated soft information using the soft information from adder 253. Minimum sum decoder 254 then computes the difference between the updated soft information and the soft information from adder 253 to generate extrinsic information. The output stream of minimum sum decoder 254 is transmitted to inputs of multipliers in the next iteration of the decoder.

The steps described above with respect to iterations 2 and 3 of the decoder of FIG. 2 are repeated for each additional iteration. However, the last iteration N of the decoder does not include a minimum sum decoder. The last block in iteration N is hard decision block 266. Hard decision block 266 converts the soft information from soft post processor 264 into a stream of symbols. The output stream of hard decision block 266 is transmitted to Reed-Solomon (RS) decoder 270. RS decoder performs RS decoding on the output stream of iteration N using RS decoding techniques. RS decoder 270 can correct many of the errors in the equalized samples that are not corrected by the minimum sum decoders.

Figure 3:
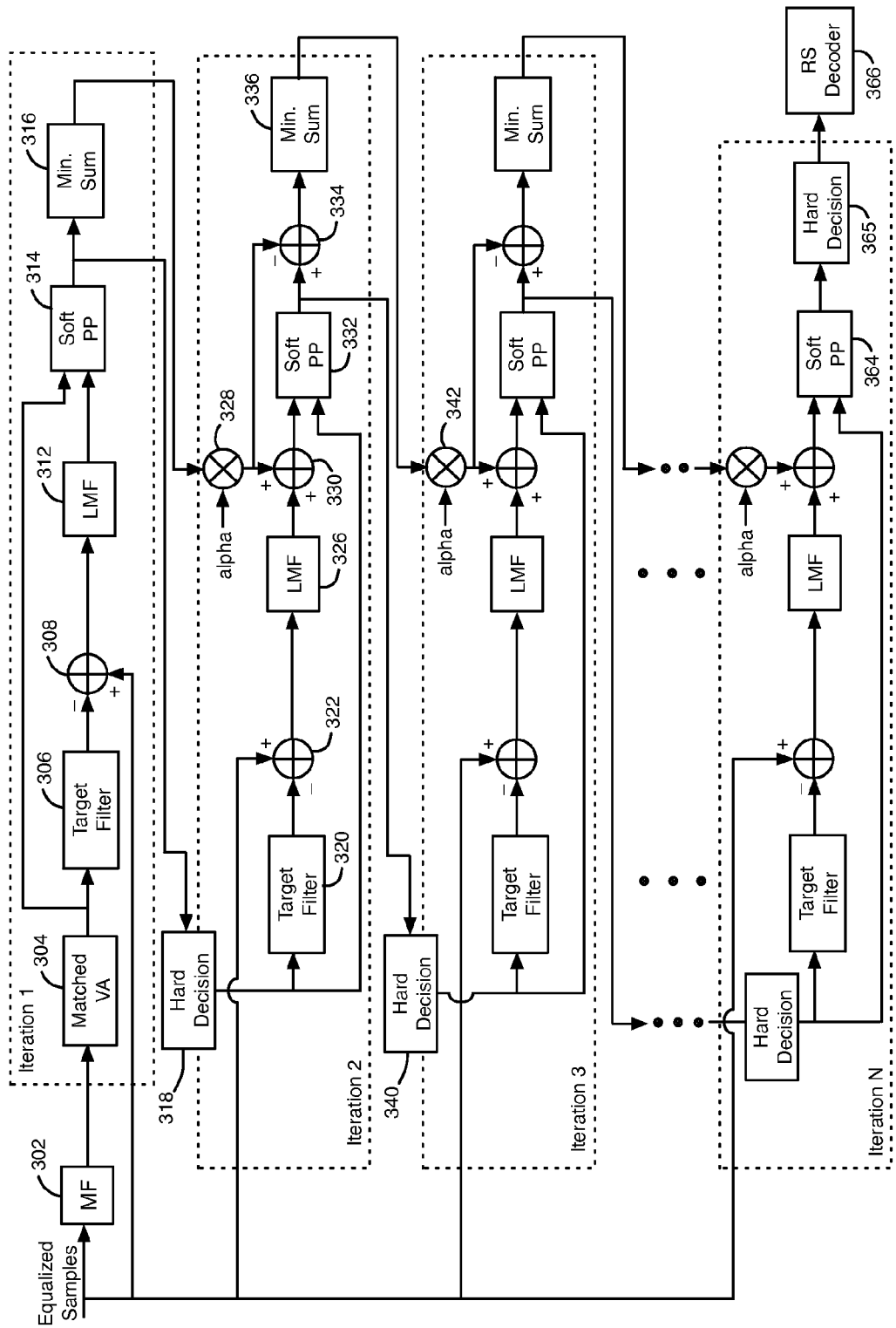
FIG. 3 illustrates a second example of an iterative error correction decoder, according to another embodiment of the present invention.

FIG. 3 illustrates a second example of an iterative error correction decoder, according to another embodiment of the present invention. MF block 302 receives equalized samples from an input equalizer (not shown), as with the previous embodiment. The decoder of FIG. 3 performs an N number of decoding iterations on the equalized samples. N can be any suitable positive integer number greater than 1. Iterations 1, 2, 3, and N are shown in FIG. 3, as an example.

Iteration 1 includes matched Viterbi algorithm 304, target filter block 306, adder 308, long match filter (LMF) block 312, soft post processor 314, and minimum sum decoder 316. Iteration 2 includes hard decision decoder 318, target filter block 320, adder 322, long match filter (LMF) block 326, multiplier 328, adder 330, soft post processor 332, adder 334, and minimum sum decoder 336. Each of the subsequent iterations performs the same steps as iteration 2, except the Nth iteration. The Nth iteration of the decoder does not have the third adder 334 or the minimum sum decoder 336.

MF block 302 generates an output stream that is transmitted to matched Viterbi detector 304. Iteration 1 begins with Viterbi detector 304. Detector 304 uses a matched Viterbi algorithm to generate an output stream from the output of MF block 302. The decoder of FIG. 3 has only one detector block 304 that uses a matched Viterbi algorithm.

The output stream generated by Viterbi algorithm 304 is transmitted to inputs of target filter block 306 and soft post processor 314. Target filter block 306 generates an output stream of recovered equalized samples that are transmitted to adder 308. Adder 308 subtracts recovered equalized samples in the output stream of target filter block 306 from corresponding original equalized samples in the input stream of the decoder to obtain the error samples.

The output stream of adder 308 is transmitted to the input of LMF block 312. Soft post processor 314 receives output streams from matched Viterbi detector 304 and LMF 312. Soft post processor 314 generates soft information including a most likely detected bit stream and reliability metric values corresponding to each detected bit. The soft information generated by post processor 314 is transmitted to an input of minimum sum decoder block 316 and an input of hard decision decoder 318.

Minimum sum decoder 316 applies a minimum sum decoding algorithm to a low density parity check (LDPC) code to generate more reliable updated soft information using the soft information generated by soft post processor 314. Minimum sum decoder 316 then computes the difference between the updated soft information and the soft information generated by soft post processor 314 to generate extrinsic information. The output stream of minimum sum decoder 316 is transmitted to an input of multiplier 328.

The minimum sum decoders used in the decoder of FIG. 3 have a low level of complexity, because they use LDPC codes that have low weights, and because they use a small number (e.g., just one or 2) of local iterations. Also, the minimum sum decoders of FIG. 3 cause less error propagation and have a more controllable error floor, because they use low weight LDPC codes and less local iterations.

In iteration 2 of the FIG. 3 decoder, hard decision decoder 318 performs hard decision decoding on the output stream of post processor 314 using any suitable hard decision decoding scheme that has a low complexity. Hard decision decoder 318 generates a decoded output stream that is transmitted to inputs of target filter block 320 and soft post processor block 332. Adder 322 subtracts recovered equalized samples in the output stream of target filter block 320 from the original equalized samples in the input stream.

The output stream of adder 322 is transmitted to LMF block 326. Multiplier 328 multiplies the output stream of minimum sum decoder 316 by a scale factor alpha. Adder 330 adds error samples in the output stream of LMF block 326 to scaled extrinsic information in the output stream of multiplier 328.

Post processor 332 receives output streams from hard decision decoder 318 and adder 330. Soft post processor 332 generates soft information including a most likely detected bit stream and reliability metric values corresponding to each detected bit. The soft information generated by post processor 332 is transmitted to an input of adder 334 and an input of hard decision decoder 340.

Adder 334 subtracts scaled extrinsic information in the output stream of multiplier 328 from the output stream of post processor 332. The output stream of adder 334 is transmitted to an input of minimum sum decoder block 336. Minimum sum decoder 336 applies a minimum sum decoding algorithm to a low density parity check (LDPC) code to generate more reliable updated soft information using the soft information from adder 334. Minimum sum decoder 336 then computes the difference between the updated soft information and the soft information from adder 334 to generate extrinsic information. The decoded output stream of decoder block 336 is transmitted to an input of multiplier 342.

Iteration 3 of the decoder begins with hard decision decoder block 340. Each additional iteration of the FIG. 3 decoder repeats the steps of iteration 2, as described above, except in the last iteration N. The last iteration N does not include adder 334 or minimum sum decoder 336. Instead, the output stream of soft post processor 364 is transmitted to a hard decision decoding block 365 to convert the soft information into hard decision symbols. RS decoder 366 decodes the output stream of hard decision block 365 using RS decoding techniques. RS decoder 366 can correct many of the errors in the equalized samples that are not corrected by the minimum sum decoders as an example.

Figure 4:
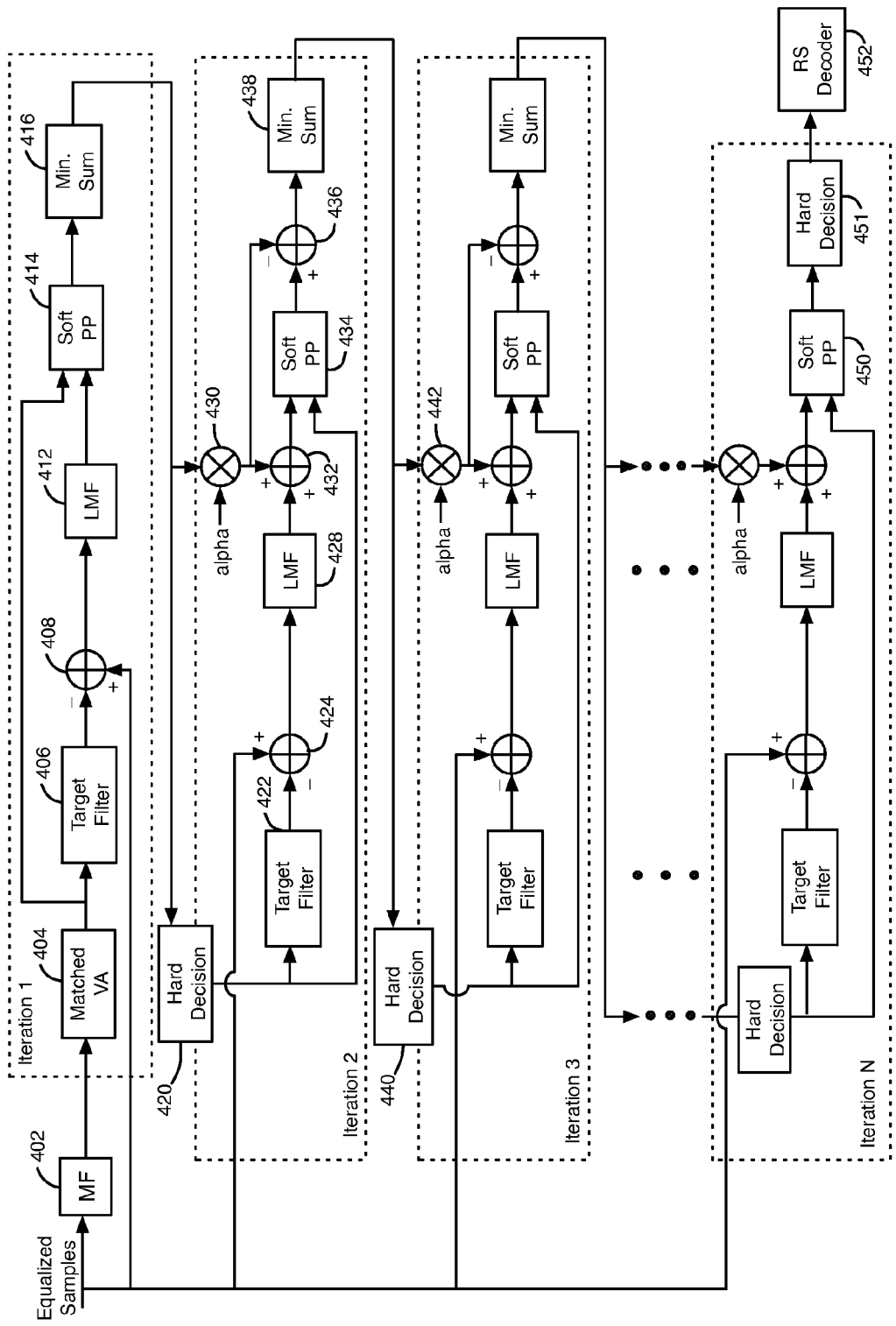
FIG. 4 illustrates a third example of an iterative error correction decoder, according to another embodiment of the present invention.

FIG. 4 illustrates a third example of an iterative error correction decoder, according to another embodiment of the present invention. MF block 402 receives equalized samples from an input equalizer (now shown), as with the previous embodiments. The decoder of FIG. 4 performs an N number of decoding iterations on the equalized samples. N can be any suitable positive integer number greater than 1. Iterations 1, 2, 3, and N are shown in FIG. 4.

Iteration 1 includes matched Viterbi algorithm 404, target filter block 406, adder 408, long match filter (LMF) block 412, soft post processor 414, and minimum sum decoder 416. Iteration 2 includes hard decision decoder 420, target filter block 422, adder 424, long match filter (LMF) block 428, multiplier 430, adder 432, soft post processor 434, adder 436, and minimum sum decoder 438. Each of the subsequent iterations performs the same steps as iteration 2, except the Nth iteration. The Nth iteration of the decoder does not have the third adder 436 or the minimum sum decoder 438.

MF block 402 generates an output stream that is transmitted to matched Viterbi detector 404. Iteration 1 of the FIG. 4 decoder begins with Viterbi detector 404. Detector 404 uses a matched Viterbi algorithm to generate an output stream from the output of MF block 402. The decoder of FIG. 4 has only one detector block 404 that uses a matched Viterbi algorithm.

The output stream generated by Viterbi algorithm 404 is transmitted to inputs of target filter block 406 and soft post processor 414. Target filter block 406 generates an output stream of recovered equalized samples that are transmitted to adder 408. Adder 408 subtracts recovered equalized samples in the output stream of target filter block 406 from corresponding original equalized samples in the input stream of the decoder.

The output stream of adder 408 is transmitted to the input of LMF block 412. Post processor 414 receives output streams from matched Viterbi detector 404 and LMF 412. Soft post processor 414 generates soft information including a most likely detected bit stream and reliability metric values corresponding to each detected bit. The soft information generated by post processor 414 is transmitted to an input of minimum sum decoder 416.

Minimum sum decoder 416 applies a minimum sum decoding algorithm to a low density parity check (LDPC) code to generate more reliable updated soft information using the soft information generated by soft post processor 414. Minimum sum decoder 416 then computes the difference between the updated soft information and the soft information generated by soft post processor 414 to generate extrinsic information. The minimum sum decoders used in the decoder of FIG. 4 have a low level of complexity, cause less error propagation, and have a more controllable error floor, because they use LDPC codes that have low weights, and because they use a small number (e.g., one or 2) of local iterations. The output stream of minimum sum decoder 416 is transmitted to inputs of multiplier 430 and hard decision decoder 420.

In iteration 2 of the FIG. 4 decoder, hard decision decoder 420 performs hard decision decoding on the output stream of minimum sum decoder 416 using any suitable hard decision decoding scheme that has a low complexity. Hard decision decoder 420 generates a decoded output stream that is transmitted to inputs of target filter block 422 and soft post processor block 434. Adder 424 subtracts the output stream of target filter block 422 from the equalized samples in the input stream.

The output stream of adder 424 is transmitted to LMF block 428. Multiplier 430 multiplies the extrinsic information in the output stream of minimum sum decoder 416 by a scale factor alpha. Adder 432 adds error samples in the output stream of LMF block 428 to scaled extrinsic information in the output stream of multiplier 430.

Post processor 434 receives output streams from hard decision decoder 420 and adder 432. Soft post processor 434 generates soft information including a most likely detected bit stream and reliability metric values corresponding to each detected bit. The soft information generated by post processor 434 is transmitted to an input of adder 436.

The output stream of post processor 434 is transmitted to an input of adder 436. Adder 436 subtracts the output stream of multiplier 430 from the output stream of post processor 434. The output stream of adder 436 is transmitted to an input of minimum sum decoder block 438. Minimum sum decoder 438 applies a minimum sum decoding algorithm to a low density parity check (LDPC) code to generate more reliable updated soft information using the soft information from adder 436. Minimum sum decoder 438 then computes the difference between the updated soft information and the soft information from adder 436 to generate extrinsic information. The output stream of decoder block 438 is transmitted to an input of hard decision decoder block 440 and multiplier 442.

Iteration 3 of the decoder begins with hard decision decoder block 440. Each additional iteration of the FIG. 4 decoder repeats the steps of iteration 2, as described above, except in the last iteration N. The last iteration N does not include adder 436 or minimum sum decoder 438. Instead, the output stream of soft post processor 450 is transmitted to hard decision decoder block 451 that converts the soft information into hard decision symbols. RS decoder 452 decodes the output stream of hard decision decoder block 451 using RS decoding techniques. RS decoder 452 can correct many of the errors in the equalized samples that are not corrected by the minimum sum decoders.

Figure 5:
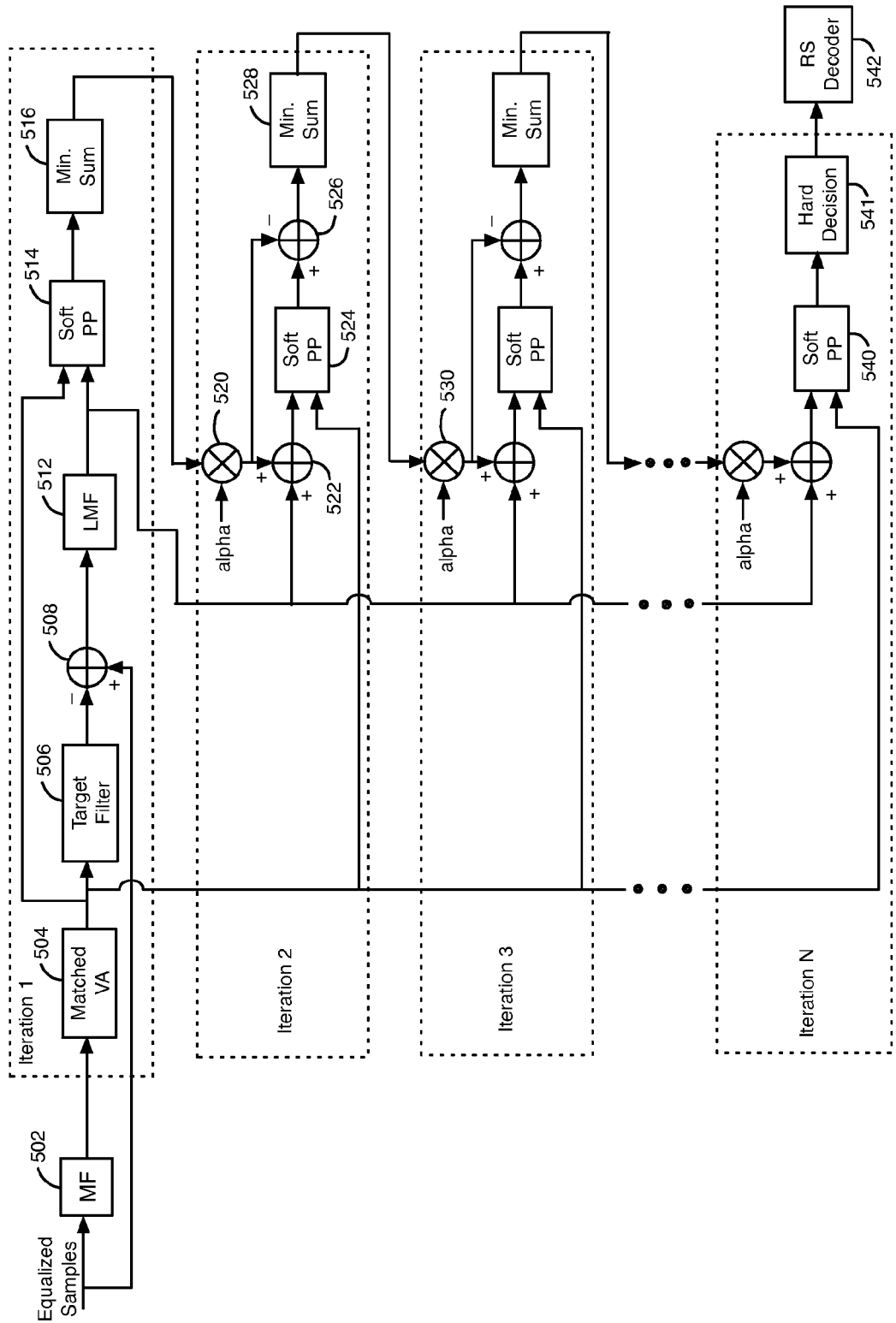
FIG. 5 illustrates a fourth example of an iterative error correction decoder, according to another embodiment of the present invention.

FIG. 5 illustrates a fourth example of an iterative error correction decoder, according to another embodiment of the present invention. MF block 502 receives equalized samples from an input equalizer (not shown), as with the previous embodiments. The decoder of FIG. 5 performs an N number of decoding iterations on the equalized samples. N can be any suitable positive integer number greater than 1. Iterations 1, 2, 3, and N are shown in FIG. 5 as an example.

Iteration 1 includes matched Viterbi algorithm 504, target filter block 506, adder 508, long match filter (LMF) block 512, soft post processor 514, and minimum sum decoder 516. Iteration 2 includes multiplier 520, adder 522, soft post processor 524, adder 526, and minimum sum decoder 528. Each of the subsequent iterations performs the same steps as iteration 2, except the Nth iteration. The Nth iteration of the decoder does not have the second adder 526 or the minimum sum decoder 528.

MF block 502 generates an output stream that is transmitted to matched Viterbi detector 504. Iteration 1 of the FIG. 5 decoder begins with Viterbi detector 504. Detector 504 uses a matched Viterbi algorithm to generate an output stream from the output stream of MF block 502. The decoder of FIG. 5 has only one Viterbi detector block 504, only one target filter 506, and only one long matched filter (LMF) block 512.

The output stream generated by Viterbi algorithm 504 is transmitted to inputs of target filter block 506 and soft post processor 514. Target filter block 506 generates an output stream of recovered equalized samples that are transmitted to adder 508. Adder 508 subtracts recovered equalized samples in the output stream of target filter block 506 from corresponding original equalized samples in the input stream of the decoder.

The output stream of adder 508 is transmitted to the input of LMF block 512. Post processor 514 receives output streams from matched Viterbi detector 504 and LMF 512. Soft post processor 514 generates soft information including a most likely detected bit stream and reliability metric values corresponding to each detected bit. The soft information generated by post processor 514 is transmitted to an input of minimum sum decoder 516.

Minimum sum decoder 516 applies a minimum sum decoding algorithm to a low density parity check (LDPC) code to generate more reliable updated soft information using the soft information generated by soft post processor 514. Minimum sum decoder 516 then computes the difference between the updated soft information and the soft information generated by soft post processor 514 to generate extrinsic information. The minimum sum decoders used in the decoder of FIG. 5 have a low level of complexity, cause less error propagation, and have a more controllable error floor, because they use LDPC codes that have low weights, and because they use a small number (e.g., one or 2) of local iterations.

The output stream of minimum sum decoder 516 is transmitted to an input of multiplier 520. Multiplier 520 multiplies the output stream of minimum sum decoder 516 by a scale factor alpha. Adder 522 adds the output stream of LMF block 512 to the scaled extrinsic information from multiplier 520.

Post processor 524 receives output streams from matched Viterbi detector 504 and adder 522. Soft post processor 524 generates soft information including a most likely detected bit stream and reliability metric values corresponding to each detected bit. The soft information generated by post processor 524 is transmitted to an input of adder 526.

Adder 526 subtracts the output stream of multiplier 520 from the output stream of post processor 524. The output stream of adder 526 is transmitted to an input of minimum sum decoder block 528. Minimum sum decoder 528 applies a minimum sum decoding algorithm to a low density parity check (LDPC) code to generate more reliable updated soft information using the soft information from adder 526. Minimum sum decoder 528 then computes the difference between the updated soft information and the soft information from adder 526 to generate extrinsic information. The output stream of decoder block 528 is transmitted to an input of multiplier 530.

Iteration 3 of the FIG. 5 decoder begins with multiplier 530. Each additional iteration of the FIG. 5 decoder repeats the steps of iteration 2, as described above, except in the last iteration N. The last iteration N does not include adder 526 or minimum sum decoder 528. Instead, the output stream of soft post processor 540 is transmitted to hard decision block 541 that converts the soft information into hard decision symbols. RS decoder 542 decodes the output stream of hard decision block 541 using RS decoding techniques. RS decoder 542 can correct many of the errors in the equalized samples that are not corrected by the minimum sum decoders.

Figure 6:
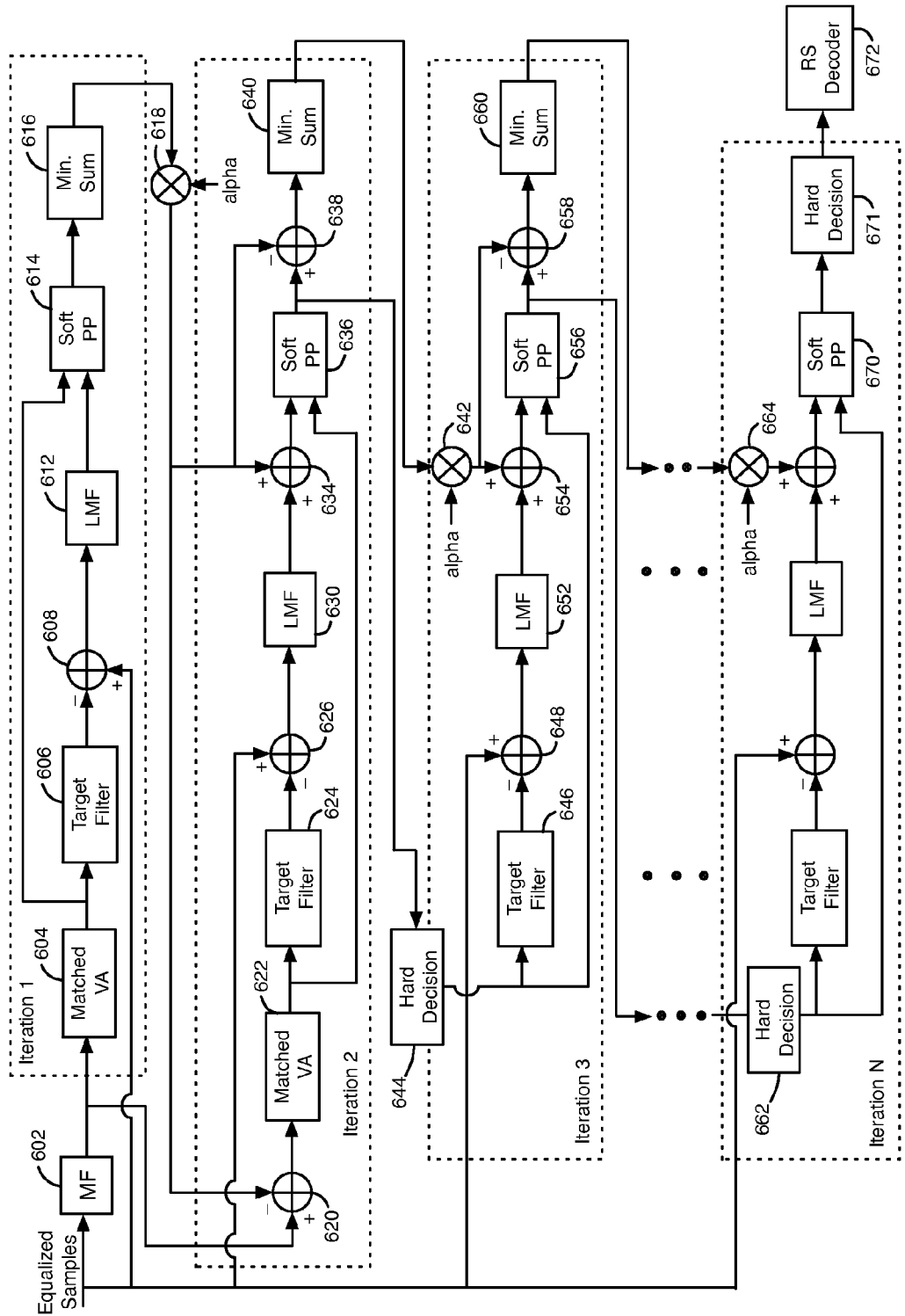
FIG. 6 illustrates a fifth example of an iterative error correction decoder, according to yet another embodiment of the present invention.

FIG. 6 illustrates a fifth example of an iterative error correction decoder, according to yet another embodiment of the present invention. MF block 602 receives equalized samples from an input equalizer (not shown), as with the previous embodiments. The decoder of FIG. 6 performs an N number of decoding iterations on the equalized samples. N can be any suitable positive integer number greater than 1. Iterations 1, 2, 3, and N are shown in FIG. 6 as an example. The decoder of FIG. 6 uses a hybrid decoding scheme that incorporates steps from the decoders of FIGS. 2 and 3.

Iteration 1 includes matched Viterbi algorithm 604, target filter block 606, adder 608, long match filter (LMF) block 612, soft post processor 614, and minimum sum decoder 616. Iteration 2 includes adder 620, matched Viterbi algorithm 622, target filter block 624, adder 626, long match filter (LMF) block 630, adder 634, soft post processor 636, adder 638, and minimum sum decoder 640. Iteration 3 includes hard decision decoder block 644, target filter block 646, adder 648, long match filter (LMF) block 652, multiplier 642, adder 654, soft post processor 656, adder 658, and minimum sum decoder 660. Each of the subsequent iterations performs the same steps as iteration 3, except the Nth iteration. The Nth iteration of the decoder does not have the third adder 658 or the minimum sum decoder 660.

In the first iteration of the decoder of FIG. 6 (iteration 1), the output stream of MF 602 is processed by a matched Viterbi algorithm in block 604. Matched Viterbi detector block 604 generates an output stream of recovered equalized samples that are transmitted to inputs of target filter block 606 and soft post processor 614.

Adder 608 subtracts the recovered equalized samples generated by target filter block 606 from the corresponding bits in the equalized samples in the input stream of the decoder. The output stream of adder 608 is transmitted to an input of long match filter (LMF) 612. LMF 612 generates an output stream that is transmitted to soft post processor 614.

Post processor 614 receives output streams from matched Viterbi detector 604 and LMF 612. Soft post processor 614 generates soft information including a most likely detected bit stream and reliability metric values corresponding to each detected bit. The soft information generated by post processor 614 is transmitted to an input of minimum sum decoder 616.

Minimum sum decoder 616 applies a minimum sum decoding algorithm to a low density parity check (LDPC) code to generate more reliable updated soft information using the soft information generated by soft post processor 614. Minimum sum decoder 616 then computes the difference between the updated soft information and the soft information generated by soft post processor 614 to generate extrinsic information. The minimum sum decoders used in the decoder of FIG. 6 have a low level of complexity, cause less error propagation, and have a more controllable error floor, because they use LDPC codes that have low weights, and because they use a small number (e.g., one or 2) of local iterations.

Minimum sum decoder 616 generates an output stream that is transmitted to multiplier 618. Multiplier 618 multiplies the output stream of minimum sum decoder 616 by scale factor alpha. The output stream of multiplier 618 is transmitted to adders 620, 634, and 638, beginning the second iteration of the decoder.

Adder 620 subtracts scaled extrinsic information in the output stream of multiplier 618 from error samples in the output stream of MF 602. Detector 622 then performs a matched Viterbi algorithm on the output stream of adder 620. Matched Viterbi detector 622 generates an output stream that is transmitted to inputs of target filter block 624 and soft post processor 636.

Adder 626 subtracts the recovered equalized samples generated by target filter block 624 from the corresponding original equalized samples in the input stream. The output stream of adder 626 is transmitted to an input of LMF 630. Adder 634 adds scaled extrinsic information in the output stream of multiplier 618 to recovered equalizes samples in the output stream of LMF 630.

Post processor 636 receives output streams from matched Viterbi detector 622 and adder 634. Soft post processor 636 generates soft information including a most likely detected bit stream and reliability metric values corresponding to each detected bit. The soft information generated by post processor 636 is transmitted to an input of adder 638 and an input of hard decision decoder 644. Adder 638 subtracts the output stream of multiplier 618 from the output stream of post processor 636.

Minimum sum decoder 640 applies a minimum sum decoding algorithm to a low density parity check (LDPC) code to generate more reliable updated soft information using the soft information from adder 638. Minimum sum decoder 640 then computes the difference between the updated soft information and the soft information from adder 638 to generate extrinsic information. The output stream of minimum sum decoder 640 is transmitted to an input of multiplier 642.

In iteration 3 of the FIG. 6 decoder, hard decision decoder 644 performs hard decision decoding on the output stream of post processor 636 using any suitable hard decision decoding scheme that has a low complexity. Hard decision decoder 644 generates a decoded output stream that is transmitted to inputs of target filter block 646 and soft post processor block 656. Adder 648 subtracts recovered equalized samples in the output stream of target filter block 646 from the original equalized samples in the input stream.

The output stream of adder 648 is transmitted to long match field (LMF) block 652. Multiplier 642 multiplies the output stream of minimum sum decoder 640 by a scale factor alpha. Adder 654 adds the output stream of LMF block 652 to the output stream of multiplier 642.

Soft post processor 656 receives output streams from hard decision decoder 644 and adder 654. Soft post processor 656 generates soft information including a most likely detected bit stream and reliability metric values corresponding to each detected bit. The soft information generated by post processor 656 is transmitted to an input of adder 658 and an input of a hard decision decoder in the next iteration (e.g., hard decision decoder 662).

Adder 658 subtracts the output stream of multiplier 642 from the output stream of post processor 656. The output stream of adder 658 is transmitted to an input of minimum sum decoder block 660. Minimum sum decoder 660 applies a minimum sum decoding algorithm to a low density parity check (LDPC) code to generate more reliable updated soft information using the soft information from 658. Minimum sum decoder 660 then computes the difference between the updated soft information and the soft information generated by adder 658 to generate extrinsic information. The output stream of decoder block 660 is transmitted to an input of a multiplier in the next iteration (e.g., multiplier 664).

Each additional iteration of the FIG. 6 decoder repeats the steps of iteration 3, as described above, except in the last iteration N. The last iteration N does not include adder 658 or minimum sum decoder 660. Instead, the output stream of soft post processor 670 is transmitted to hard decision decoder 671 that converts the soft information into hard decision symbols. RS decoder 672 decodes the output stream of hard decision block 671 using RS decoding techniques. RS decoder 672 can correct many of the errors in the equalized samples that are not corrected by the minimum sum decoders and post-processor.

Figure 7:
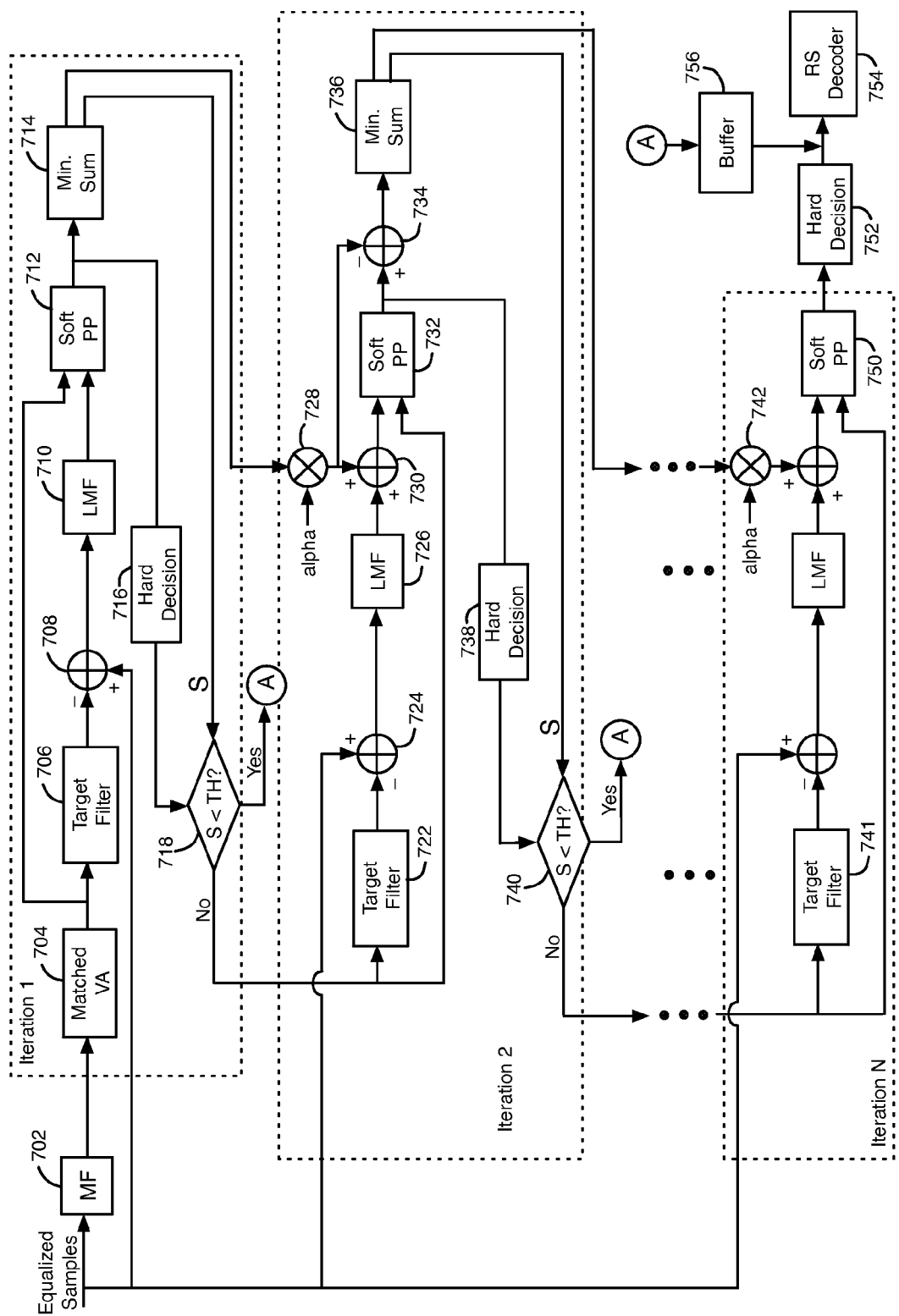
FIG. 7 illustrates a sixth example of an iterative error correction decoder, according to still another embodiment of the present invention.

In order to reduce the power consumption of an iterative detector, a new feature can be added to the schemes shown in FIGS. 2-6 that can allow the iterative detector to stop before the end of the last iteration. FIG. 7 illustrates an example of an early stop iterative decoder, according to an embodiment of the present invention. The iterative decoder of FIG. 7 is based on the detection scheme of FIG. 3. According to further embodiments of the present invention, early stop techniques can be used in all of the detection schemes shown in FIGS. 2-6.

The decoder of FIG. 7 performs a 1 to N number of decoding iterations on the equalized samples. The number of decoding iterations is determined based on whether a stop condition (S<TH) at blocks 718, 740, etc. is satisfied or not. S is the stop condition value computed by minimum-sum decoding blocks 714 and 736, etc., based on the checksum violation or the least reliable value among the LDPC code block. TH is a pre-defined threshold parameter. The maximum number N of iterations can be any suitable positive integer number greater than 1. Iterations 1, 2, and N are shown in FIG. 7 as an example.

Iteration 1 includes matched Viterbi algorithm 704, target filter block 706, adder 708, long match filter (LMF) block 710, soft post processor 712, minimum sum decoder 714, hard decision decoder 716, and stop block 718. Iteration 2 includes target filter block 722, adder 724, long match filter (LMF) block 726, multiplier 728, adder 730, soft post processor 732, adder 734, minimum sum decoder 736, hard decision decoder 738, and stop block 740. Each of the subsequent iterations performs the same steps as iteration 2, except the Nth iteration. The Nth iteration of the decoder does not have the third adder 734, the minimum sum decoder 736, the hard decision decoder 738, or the stop block 740.

Initially, MF block 702 receives equalized samples from an input equalizer (not shown), as with the previous embodiments. MF block 702 generates an output stream that is transmitted to matched Viterbi detector 704. Iteration 1 begins with Viterbi detector 704. Detector 704 uses a matched Viterbi algorithm to generate an output stream from the output of MF block 702. The decoder of FIG. 7 has only one detector block 704 that uses a matched Viterbi algorithm.

The output stream generated by Viterbi algorithm 704 is transmitted to inputs of target filter block 706 and soft post processor 712. Target filter block 706 generates an output stream of recovered equalized samples that are transmitted to adder 708. Adder 708 subtracts recovered equalized samples in the output stream of target filter block 706 from corresponding original equalized samples in the input stream of the decoder to obtain the error samples.

The output stream of adder 708 is transmitted to the input of LMF block 710. Soft post processor 712 receives output streams from matched Viterbi detector 704 and LMF 710. Soft post processor 712 generates soft information including a most likely detected bit stream and reliability metric values corresponding to each detected bit. The soft information generated by post processor 712 is transmitted to an input of minimum sum decoder block 714 and an input of hard decision decoder 716.

Minimum sum decoder 714 applies a minimum sum decoding algorithm to a low density parity check (LDPC) code to generate more reliable updated soft information using the soft information generated by soft post processor 712. Minimum sum decoder 714 then computes the difference between the updated soft information and the soft information generated by soft post processor 712 to generate extrinsic information. The extrinsic information in the output stream of minimum sum decoder 714 is transmitted to an input of multiplier 728. Minimum sum decoder 714 also generates an early stop value S that is transmitted to stop block 718. S can be, for example, the number of syndromes that are not satisfied.

The minimum sum decoders used in the decoder of FIG. 7 have a low level of complexity, cause less error propagation, and have a more controllable error floor, because they use LDPC codes that have low weights, and because they use a small number (e.g., one or 2) of local iterations.

Hard decision decoder 716 performs hard decision decoding on the output stream of post processor 712 using any suitable hard decision-decoding scheme that has a low complexity to generate a decoded output stream. The stop condition (S<TH) in stop block 718 determines which block the decoded output stream of hard decision decoder 716 is transmitted to. At stop block 718, if the stop condition S<TH is satisfied, the decoded output stream from hard decision decoder 716 is transmitted directly to buffer block 756 (via A in FIG. 7) and then to Reed-Solomon decoder 754, without running through the rest of the iterations in the iterative decoder.

If the stop condition S<TH is not satisfied, the iterative decoder of FIG. 7 proceeds to iteration 2. In iteration 2, the decoded output stream from hard decision decoder 716 is transmitted to inputs of target filter block 722 and soft post processor block 732. Adder 724 subtracts recovered equalized samples in the output stream of target filter block 722 from the original equalized samples in the input stream.

The output stream of adder 724 is transmitted to LMF block 726. Multiplier 728 multiplies the extrinsic information in the output stream of minimum sum decoder 714 by a scale factor alpha. Adder 730 adds error samples in the output stream of LMF block 726 to scaled extrinsic information in the output stream of multiplier 728.

Post processor 732 receives output streams from hard decision decoder 716 and adder 730. Soft post processor 732 generates soft information including a most likely detected bit stream and reliability metric values corresponding to each detected bit. The soft information generated by post processor 732 is transmitted to an input of adder 734 and an input of hard decision decoder 738.

Adder 734 subtracts scaled extrinsic information in the output stream of multiplier 728 from the output stream of post processor 732. The output stream of adder 734 is transmitted to an input of minimum sum decoder block 736. Minimum sum decoder 736 applies a minimum sum decoding algorithm to a low density parity check (LDPC) code to generate more reliable updated soft information using the soft information from adder 734. Minimum sum decoder 736 then computes the difference between the updated soft information and the soft information from adder 734 to generate extrinsic information. The extrinsic information in the decoded output stream of decoder block 736 is transmitted to an input of a multiplier in the next iteration (e.g., multiplier 742). Minimum sum decoder 736 also generates an early stop value S that is transmitted to stop block 740. S can be, for example, the number of syndromes that are not satisfied.

Hard decision decoder block 738 performs hard decision decoding on the output stream of post processor 732 using any suitable hard decision-decoding scheme that has a low complexity. The threshold condition (S<TH) in stop block 740 determines which block the decoded output stream of hard decision decoder 738 is transmitted to. At stop block 740, if the stop condition S<TH is satisfied, the decoded output stream from hard decision decoder 740 is transmitted directly to buffer block 756 (via A in FIG. 7) and then to Reed-Solomon decoder 754 without running through the rest of the iterations in the iterative decoder.

If the stop condition S<TH is not satisfied, the iterative decoder of FIG. 7 proceeds to iteration 3, and the decoded output stream of hard decision decoder 738 is transmitted to a target filter and a soft post processor in iteration 3. Iteration 3 of the decoder begins with a target filter block such as target filter block 741. Each additional iteration of the FIG. 7 decoder repeats the steps of iteration 2, as described above, except in the last iteration N. The last iteration N does not include adder 734, minimum sum decoder 736, hard decision decoder 738, or stop block 740. Instead, the output stream of soft post processor 750 is transmitted to a hard decision decoding block 752 to convert the soft information into hard decision symbols. RS decoder 754 decodes the output stream of hard decision block 752 using RS decoding techniques. RS decoder 754 can correct many of the errors in the equalized samples that are not corrected by the minimum sum decoders.

According to various embodiments of the present invention, the blocks described above with respect to FIGS. 1-7 can be implemented in hardware circuitry, in software, or in a combination of hardware and software. According to some embodiments of the present invention, an iterative decoder can be implemented by using only one of each type of block, and repeating the steps described above over and over again using the same set of blocks in each iteration rather using different blocks in each iteration. For example, an iterative decoder of the present invention can have one post processor and one minimum sum decoder. In each iteration, the decoding is performed using the same post processor and the same minimum sum decoder.

The foregoing description of the exemplary embodiments of the present invention has been presented for the purposes of illustration and description and are not intended to be exhaustive or to limit the scope of the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. A data storage device comprising an iterative decoder for correcting errors in data recorded on a data storage medium, wherein in a plurality of iterations of the iterative decoder:
   a post processing block generates soft information for the data; and
   a minimum sum decoder applies a minimum sum decoding algorithm to a low density parity check code to generate extrinsic information based on the soft information and updated soft information,
   wherein in a first iteration of the iterative decoder, a first detector performs a matched Viterbi algorithm on the data, and the output stream of the first detector is provided to the post processing block in the first iteration, and
   wherein in a second iteration of the iterative decoder, a second detector performs a matched Viterbi algorithm on the data, and the output stream of the second detector is provided to the post processing block in the second iteration.

2. The data storage device defined in claim 1 wherein a hard decision decoder decodes the data using the soft information from the post processing block.

3. The data storage device defined in claim 2 wherein the iterative decoder does not perform an additional iteration if early stop parameters generated by the minimum sum decoder are less than a threshold value.

4. The data storage device defined in claim 1 further comprising:
   a Reed-Solomon decoder that decodes data received from the iterative decoder.

5. The data storage device defined in claim 1 wherein the data storage device is a hard disk drive.

6. The data storage device defined in claim 1 wherein the iterative decoder performs at least three iterations if a stop condition is not satisfied.

7. A data storage device comprising an iterative decoder for correcting errors in data recorded on a data storage medium, wherein in a plurality of iterations of the iterative decoder:
a post processing block generates soft information for the data and
a minimum sum decoder applies a minimum sum decoding algorithm to a low density parity check code to generate extrinsic information based on the soft information and updated soft information,
wherein in an iteration of the iterative decoder, a detector performs a matched Viterbi algorithm on the data, and the output stream of the detector is provided to the post processing block in the iteration, and
wherein in the iteration of the iterative decoder,
a target filter filters the output stream of the detector;
an adder adds an output stream of the target filter to equalized samples in an input stream of the iterative decoder; and
a long match filter filters an output stream of the adder, wherein an output stream of the long match filter is provided to the post processing block.

8. A data storage device comprising an iterative decoder for correcting errors in data recorded on a data storage medium, wherein in a plurality of iterations of the iterative decoder:
a post processing block generates soft information for the data; and
a minimum sum decoder applies a minimum sum decoding algorithm to a low density parity check code to generate extrinsic information based on the soft information and updated soft information,
wherein in a second iteration of the iterative decoder:
a multiplier multiplies the extrinsic information from a first iteration of the iterative decoder by a scale factor to generate scaled extrinsic information, and
the post processing block in the second iteration comprises a post processor and an adder, wherein the adder adds an output stream of the post processor to the scaled extrinsic information to generate the soft information.

9. A method for correcting errors in data in a data storage device using an iterative decoder, wherein in multiple iterations of the iterative decoder the method comprises:
generating soft information relating to the data using a post processing block; and
generating extrinsic information that is based on a difference between the soft information and updated soft information using a minimum sum decoder that applies a minimum sum decoding algorithm to a low density parity check code,
wherein in a first iteration of the iterative decoder the method further comprises:
filtering an output stream of a first detector using a first target filter; and
adding an output stream of the first target filter to equalized samples representing the data using a first adder.

10. The method defined in claim 9 wherein in the first iteration of the iterative decoder the method further comprises:
performing a matched Viterbi algorithm on the data using the first detector, wherein the output stream of the first detector is provided to the post processing block.

11. The method defined in claim 9 wherein in the first iteration the method further comprises:
filtering an output stream of the first adder using a first long match filter; and
transmitting an output stream of the first long match filter to the post processing block.

12. The method defined in claim 11 wherein in a second iteration of the iterative decoder the method further comprises:
filtering an output stream of the first iteration using a second target filter;
adding an output stream of the second target filter to the equalized samples using a second adder;
filtering an output stream of the second adder using a second long match filter;
multiplying the extrinsic information generated by the minimum sum decoder in the first iteration by a scale factor using a multiplier to generate scaled extrinsic information;
adding the scaled extrinsic information to an output stream of the second long match filter using a third adder; and
transmitting an output stream of the third adder to the post processing block in the second iteration, wherein the post processing block in the second iteration comprises a post processor and a fourth adder that adds an output stream of the post processor to the scaled extrinsic information to generate the soft information.

13. The method defined in claim 9 wherein, in at least one iteration of the iterative decoder, the method further comprises:
performing hard decision decoding using the soft information from the post processing block.

14. The method defined in claim 9 wherein the iterative decoder performs at least three iterations if a stop condition is not satisfied.

15. The method defined in claim 9, wherein in an iteration of the iterative decoder the method further comprises:
performing hard decision decoding on the extrinsic information generated by the minimum sum decoder to generate symbols that are provided to the post processing block in a subsequent iteration of the iterative decoder.

16. A data storage device comprising an iterative decoder for correcting errors in data recorded on a data storage medium, wherein the iterative decoder comprises:
a first filter that generates an output stream;
an adder that adds the output stream of the first filter to equalized samples in an input stream of the iterative decoder;
a second filter that filters an output stream of the adder;
a first post processing block that generates first soft information for the data in a first iteration of the iterative decoder, wherein an output stream of the second filter is provided to the first post processing block; and
a first decoder that applies a minimum sum decoding algorithm to a low density parity check code to generate updated first soft information and first extrinsic information that is based on a difference between the updated first soft information and the first soft information.

17. The data storage device defined in claim 16 wherein the iterative decoder further comprises a first detector that performs a matched Viterbi algorithm on the data, and wherein the output stream of the first detector is transmitted to an input of the first post processing block.

18. The data storage device defined in claim 16 wherein the iterative decoder further comprises a hard decision decoder that performs hard decision decoding using the first soft information.

19. The data storage device defined in claim 16 further comprising:
a second post processing block that generates second soft information for the data in a second iteration of the iterative decoder in response to an output stream of the first iteration; and a second decoder that applies a minimum sum decoding algorithm to a low density parity check code to generate updated second soft information and second extrinsic information that is based on a difference between the updated second soft information and the second soft information, wherein the iterative decoder further comprises a hard decision decoder that performs hard decision decoding using the first extrinsic information, and symbols generated by the hard decision decoder are transmitted to an input of the second post processing block.

20. The data storage device defined in claim 19 wherein the iterative decoder stops performing iterations if early stop parameters generated by the first decoder are less than a threshold value, and the symbols generated by the hard decision decoder are provided to the second post processing block only if the early stop parameters are greater than or equal to the threshold value.

* * * * *